(12) United States Patent
Lu

(10) Patent No.: US 11,983,113 B2
(45) Date of Patent: *May 14, 2024

(54) METHOD FOR COPYING DATA WITHIN MEMORY DEVICE, MEMORY DEVICE, AND ELECTRONIC DEVICE THEREOF

(71) Applicant: Taiwan Semiconductor Manufacturing Company, Ltd., Hsinchu (TW)

(72) Inventor: Shih-Lien Linus Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/080,706

(22) Filed: Dec. 13, 2022

(65) Prior Publication Data

US 2023/0113508 A1    Apr. 13, 2023

Related U.S. Application Data

(63) Continuation of application No. 17/096,957, filed on Nov. 13, 2020, now Pat. No. 11,567,868.

(51) Int. Cl.
| | | |
|---|---|---|
| *G06F 12/0804* | (2016.01) | |
| *G06F 12/06* | (2006.01) | |
| *G11C 11/4093* | (2006.01) | |
| *G11C 11/4096* | (2006.01) | |

(52) U.S. Cl.
CPC ......... *G06F 12/0804* (2013.01); *G06F 12/06* (2013.01); *G11C 11/4093* (2013.01); *G11C 11/4096* (2013.01); *G06F 2212/1041* (2013.01)

(58) Field of Classification Search
CPC ................. G06F 12/0804; G06F 12/06; G06F 2212/1041; G11C 11/4093; G11C 11/4096
See application file for complete search history.

(56) References Cited

U.S. PATENT DOCUMENTS

| | | | |
|---|---|---|---|
| 5,237,531 A | * 8/1993 | Okano | ................. G06F 12/1433 |
| | | | 711/E12.1 |
| 2009/0052269 A1 | * 2/2009 | Moschiano | ............ G11C 16/10 |
| | | | 365/230.03 |

(Continued)

FOREIGN PATENT DOCUMENTS

KR    20190123746    11/2019

*Primary Examiner* — Prasith Thammavong
(74) *Attorney, Agent, or Firm* — JCIPRNET

(57) ABSTRACT

A memory device is described, including a command decoder configured to receive a copy command to copy data stored in a first memory location to a second memory location without transmitting the data to an external controller, a memory array electrically connected to the command decoder and including a plurality of memory locations including the first memory location and the second memory location, a data line electrically connected to the memory array and configured to receive, from the first memory location, the data to be transmitted to the second memory location through the same data line, and an output buffer configured to store the data received from the first memory location through the data line to be written into the second memory location without transmitting the data to the external controller.

20 Claims, 17 Drawing Sheets

104

(56) References Cited

U.S. PATENT DOCUMENTS

2010/0023817 A1\* 1/2010 Park .................. G11C 29/08
              714/718
2021/0209022 A1\* 7/2021 Song .................. G06N 3/063
2022/0076717 A1\* 3/2022 Mathew .............. G06F 3/061

\* cited by examiner

| Command | CS# | RAS# | CAS# | WE# | Special Read | Special Write |
|---|---|---|---|---|---|---|
| Active | L | L | H | H | L | L |
| Read | L | H | L | H | L | L |
| Write | L | H | L | L | L | L |
| Copy or Move | L | H | L | H | H — 401 | L |
| Copy or Move | L | H | L | L | L | H — 402 |

FIG. 4A

| | Special Read | Special Write |
|---|---|---|
| Special_move=0 | L | L |
| Special_move=1 | H | H |

FIG. 4B

METHOD FOR COPYING DATA WITHIN MEMORY DEVICE, MEMORY DEVICE, AND ELECTRONIC DEVICE THEREOF

CROSS-REFERENCE TO RELATED APPLICATION

This application is a continuation application of and claims the priority benefit of a prior application Ser. No. 17/096,957, filed on Nov. 13, 2020. The entirety of the above-mentioned patent application is hereby incorporated by reference herein and made a part of this specification.

BACKGROUND

In general, for a volatile memory device which stores binary data temporarily such as a dynamic random access memory (DRAM), a static random access memory (SRAM), a resistive random access memory (RRAM), and the like, copying a block of data from a first location of the memory device to a second location of the memory device would consume a significant amount of time and energy to complete. Typically, a copy operation to copy a block of data from one part of the memory device to another part of the memory device or a move operation to move the block of data from one part of the memory device to another part of the memory device would involve performing a read operation in the first location of the memory device to obtain the data stored in the first location, transferring the data out of the memory device to a central processing unit (CPU) or a memory controller, and subsequently transferring the data from the CPU back to the memory device in order to be written into the second memory. Such operation could consume a significant amount of time as multiple iterations of read operations and write operations could be performed, and such operation could also consume a significant amount of energy as blocks of data could be moved outside of the memory device and be received back inside the memory device.

In order to perform a move operation or a copy operation without transferring the data to a memory controller or a CPU, several approaches could be taken. One approach is to first copy the data from a first memory location to a sense amplifier which is typically connected to multiple cells and then to copy the data from the sense amplifier to a second memory location. Even though this technique does not require additional hardware, such approach is limited to copying data within the same memory bank but is unable to copy the data beyond the same memory bank. Another approach is to add additional hardware such as a temporarily memory storage location commonly known as "dummy row" techniques which may involve copying data from a first memory location to the temporary memory storage and then copy from the temporary memory storage to the second memory location. However, such technique would involve additional hardware. Other currently known techniques involve modifying the internal circuitry of the memory device to create the required data paths as well as to generate the needed signals. These techniques may involve significant hardware addition to internal circuitry and also require additional energies for the additional signals.

Since minimizing the use of additional hardware and energy consumption has been the trend of the design of the memory device, a future design of the memory device which does not require transferring the data outside of the memory device and does not require a significant amount of hardware additions for performing the copy or move operation could be helpful for improving the efficiency of the memory device as well as the overall performance of the electronic device which uses the memory device.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4A is a table showing a correspondence relationship between input signals and commands according to an exemplary embodiment of the disclosure.

FIG. 4B is a truth table of the special move command according to an exemplary embodiment of the disclosure.

DETAILED DESCRIPTION OF DISCLOSED EMBODIMENTS

Figure 1:
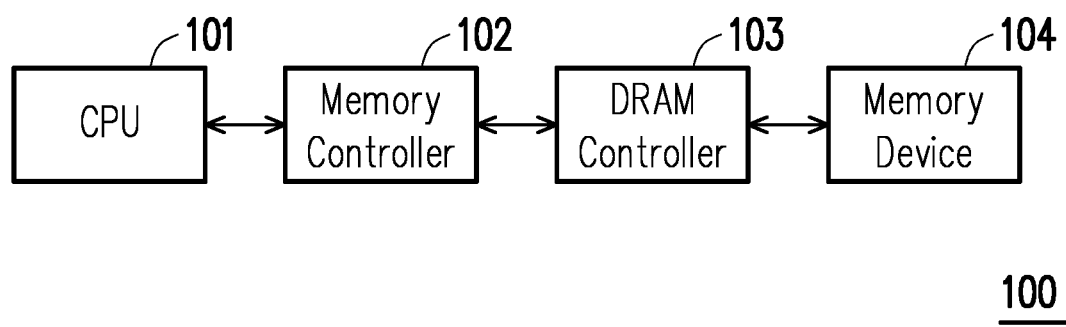
FIG. 1 is a conceptual block diagram of an electronic device having a memory device according to an exemplary embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference will now be made in detail to the present exemplary embodiments of the disclosure, examples of which are illustrated in the accompanying drawings. Wherever possible, the same reference numbers are used in the drawings and the description to refer to the same or like parts.

The disclosure provides a move or a copy operation of a memory device as a mean to move or copy a block of data from a first memory location to a second memory location within the memory device without transmitting the data to an external controller. The memory device, which implements the copy or move operation does not need to significantly modify the hardware architecture of the existing memory device in order to generate needed signals and data paths to implement the move or the copy operation. The first memory location could be any memory location of the memory device, and the second memory location could be from a different memory array or a different memory bank or from within the same memory array or from within the same memory bank. The above described another memory location could also be another row, another section or another page within the same memory bank. The external controller could be, for example, a DRAM controller, a memory controller, a central processor unit (CPU), or another external processor or controller. Accordingly, the disclosure provides a mean to move a block of data, such as image data of graphics, from one location to another location within DRAM chip(s).

To utilize the disclosure, two new C library functions, memcpy and bcopy, could be made available for users. The function memcpy (void *str1, const void *str 2, size_t n) copies n characters from memory area pointed by str2 to memory area pointed by str1. The function bcopy (const void *src, void *dest, size_t n) copies n bytes from the address pointed by src to the destination pointed by dest. In the chip level, the move or copy command of this disclosure could be utilized by a new command having the form of, for example, Move (A, B, N) where A is the source address, B is the destination address, and N is the number of data blocks as each block has the width of the READ FIFO memory buffer.

The move or the copy operation could be realized by introducing a new command, which could be, for example, a COPY command. The COPY command would perform the previously described move operation or copy operation by combining an existing READ command and an existing WRITE command. The disclosure provides an input or a set of inputs which would be decoded as the new command. The disclosure also provides modifications to functions associated with existing read command which may not output data to an output buffer to be read by an external controller when a COPY command has been received. Also, the existing READ command would to be followed by a WRITE command in order to write the output data to the second memory location. The above described concept of COPY command and its associated modifications are elucidated by the following figures and their corresponding written descriptions.

FIG. 1 shows a conceptual block diagram an electronic device 100 having a memory device 104. The electronic device 100 includes a CPU, a memory controller 102, a DRAM controller 103, and a memory device 104. The memory device 104 would receive a set of signals to be decoded as a COPY command which originates from the CPU 101 and transmitted through the memory controller 102 and the DRAM controller 103. The COPY command would copy a block of data from a first memory location to a second memory location by performing a READ operation from the first memory location followed by a WRITE operation to the second memory location, and the block of data is not read by the DRAM controller and is not sent back to the CPU. The functions of the CPU 101, the memory controller 102 and the DRAM controller 103 are consistent with the currently known CPU 101, memory controller 102 and the DRAM controller 103 and thus a description of their respective functions would not be necessary.

Figure 2A:
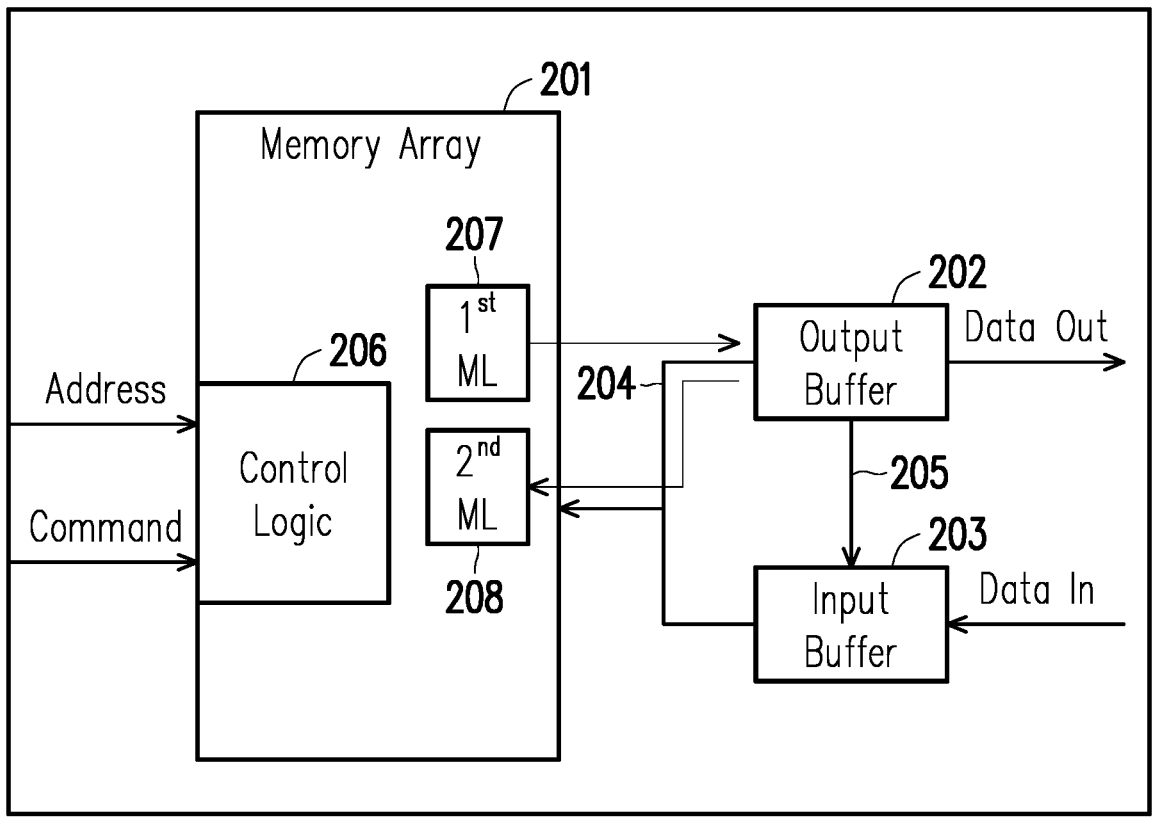
FIG. 2A is a conceptual block diagram of a memory device according to an exemplary embodiment of the disclosure.

The disclosure provides a memory device 104 which for example implements the COPY command. A conceptual block diagram of the memory device 104 is shown in FIG. 2A.

The memory device 104 would include a memory array 201, a control logic 206 electrically coupled to at least one memory array 201 which is electrically coupled to an output buffer 202 and an input buffer 203 through a data line 204. The control logic 206 would include a command decoder configured to receive a copy command to copy data stored in a first memory location 207 to a second memory location 208 without transmitting the data to an external controller (e.g. the CPU 101, the memory controller 102 and the DRAM controller 103). The memory array 201 would include one or more memory arrays electrically connected to the command decoder of the control logic 206 and includes multiple memory locations which include a first memory location 207 and a second memory location 208. The first memory location 207 and the second memory location 208 could be located in the same or different memory arrays or memory banks. The first memory location 207 and the second memory location 208 could also be different rows, different columns, different pages, or different sections within the same memory bank. The memory array 201 would be electrically connected to the output buffer 202 through the data line 204 which is configured to receive, from the first memory location 207, the data to be transmitted to the second memory location 208 through the same data line and also electrically connected to the output buffer 202 which is configured to store the data received from the first memory location 207 through the data line 204 to be written into the second memory location 208 without transmitting the data to the external controller.

The command decoder of the control logic 206 may include a special read input 302 and a special write input 303 as the copy command is determined based on at least a first predetermined binary value (e.g. '1') received by the special read input and a second predetermined binary value (e.g. '1') received by the special write input. The first predetermined binary value could be the same or different from the second predetermined binary value. The control logic 206 could be configured to initiate a normal read procedure in response to receiving an active command when the special read input is not the first predetermined binary value (e.g. "0"). However, the control logic 206 could be configured to initiate a copy procedure corresponding to the copy command in response to receiving the active command and the special read input is the first predetermined binary value (e.g. '1'). In other words, the memory device 104 may execute a normal set of finite state machine (FSM) when the special read input is not the first predetermined binary value but may execute an alternative set of FSM when the special read input is the first predetermined binary value. The copy procedure corresponding to the copy command may include the normal read procedure and a normal write procedure. The normal read procedure may include reading from the first memory location 207 and the normal write procedure would include writing into the second memory location 208.

The output buffer 202 may include a first input/output interface connected to the data line 204 and a second input/output interface connected to a read driver as the data is received by the output buffer 202 in response to the special read input receiving the first predetermined binary value. For this exemplary embodiment, the control logic 206 would be configured to control the output buffer 202 to output the data directly back to the data line 204 to be written into the second memory location 208 instead of being received by the external controller in response to the special write input receiving the second predetermined binary value (e.g. '1'). Accordingly, a block of data is moved from one location to another location within DRAM chip(s).

Figure 2B:
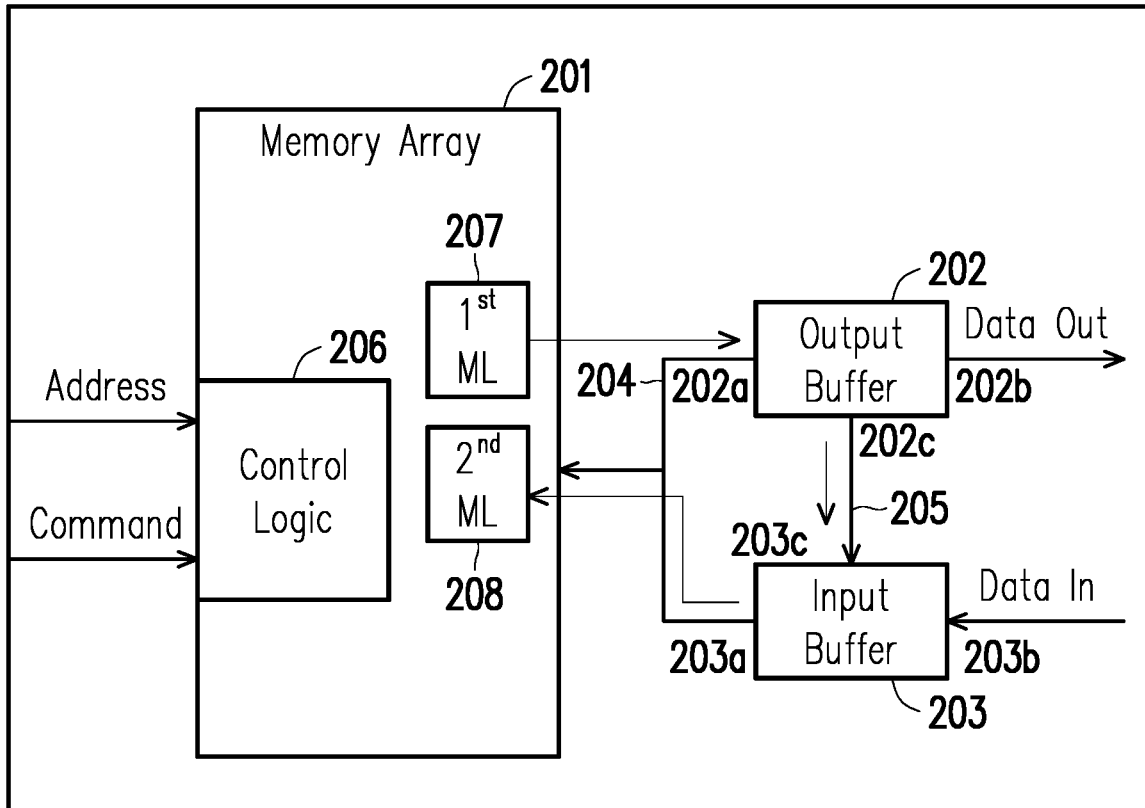
FIG. 2B is a conceptual block diagram of a memory device according to another exemplary embodiment of the disclosure.

FIG. 2B shows an alternative exemplary embodiment which is similar to FIG. 2A. For this exemplary embodiment, the input buffer 203 includes a first interface 203a connected to a global input/output data line 204, a second interface 203b connected to a write driver, and a third interface 203c connected to a data line 205 through which the output buffer 202 may transfer data to the input buffer 203 so as to write the data stored in the first memory location 207 to the second memory location 208. In other words, the data stored in the first memory location 207 could be transmitted from the first memory location 207 through the output buffer 202 and subsequently to the input buffer 203 through the third interface 203c. A data could be copied from the first memory location 207 and directly written back to into the second memory location 208 without being transmitted to an external controller.

Similarly, a data could also be written by the write driver according to the received data received by the input buffer 203, and transmitted to the second memory location 208. In some embodiment, the data stored by the first memory location 207 is transmitted from the first memory location 207 to the output buffer 202 and written by the write driver according to the received data. The written data is transmitted from the output buffer 202 through the input buffer 203 to the second memory location 208 without transmitting the data to an external controller.

The disclosure also provides an electronic device 100 which includes a controller (e.g.

the CPU 101, the memory controller 102 and the DRAM controller 103) and a memory device 104 electrically connected to the controller. The memory device 104 includes a command decoder configured to receive a copy command to copy data stored in a first memory location to a second memory location without transmitting the data to the controller, a memory array 201 having one or more memory arrays, each memory array having multiple memory banks, electrically connected to the command decoder and including a plurality of memory locations including the first memory location 207 and the second memory location 208, a data line 204 electrically connected to the memory array 201 and configured to receive, from the first memory location 207, the data to be transmitted to the second memory location 208 location through the same data line 204, and an output buffer 202 configured to store the data received from the first memory location 207 through the data line 204 to be written into the second memory location 208 without transmitting the data to the controller.

For the CPU 101, the command decoder may include a special read input (e.g. 302) and a special write input (e.g. 303) as the copy command is determined based on at least a first predetermined binary value (e.g. '1') received by the special read input and a second predetermined binary value (e.g. '1') received by the special write input. The output buffer 202 may include a first interface 202a connected to the data line 204 and a second interface 202b connected to a read driver as the data is received by the output buffer in response to the special read input receiving the first predetermined binary value. The output buffer 202 may be configured to output the data directly back to the data line 204 to be written into the second memory location 208 instead of being received by the controller.

The electronic device 100 as shown in the embodiment of FIG. 2B, may further include an input buffer 203 that includes a first interface 203a connected to the data line 204, a second interface 203b connected to a write driver, and a third interface 203c connected to the output buffer 205, and the input buffer 203 could be configured to receive the data transferred from the output buffer 202 directly through the third interface 203c so as to output the data to the data line 204 to be written into the second memory location 208 without transmitting the data to the controller.

Figure 3A:
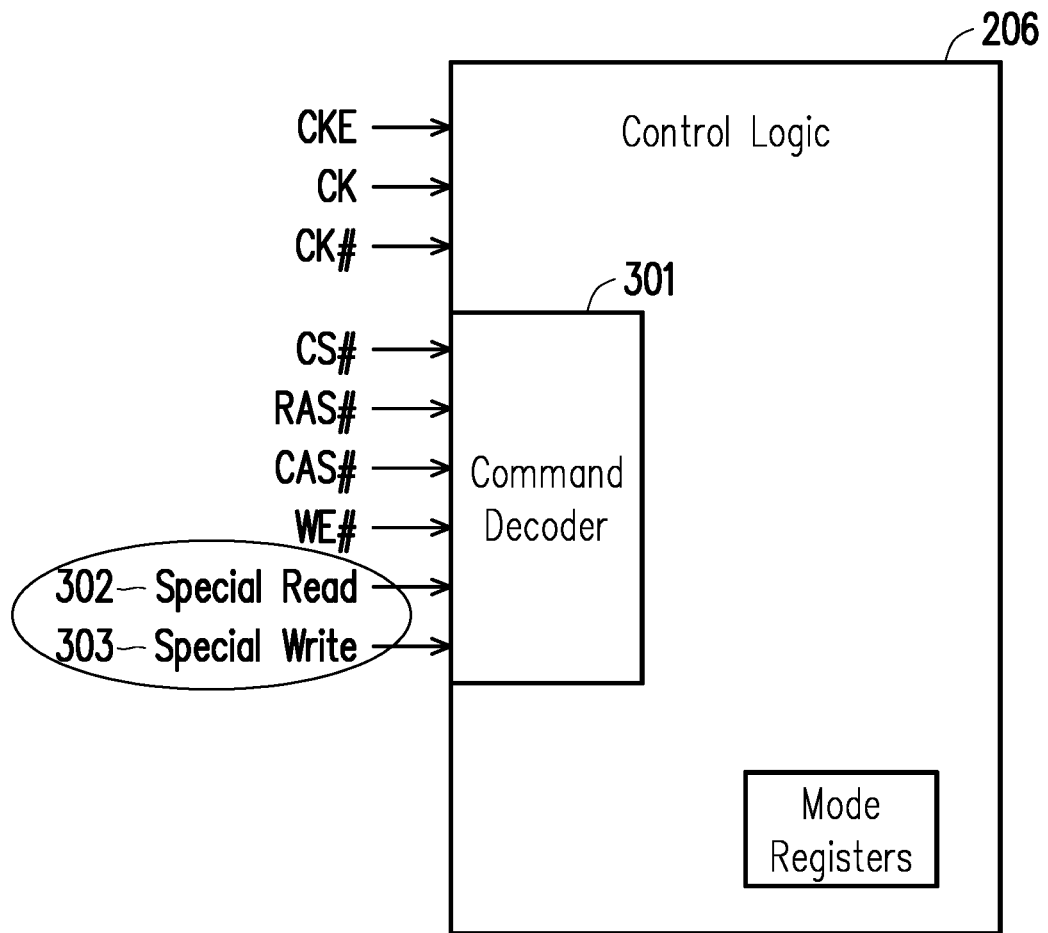
FIG. 3A is a conceptual block diagram of a command decoder of a memory device according to an exemplary embodiment of the disclosure.

The COPY command could be sent from, for example, the CPU 101 or generated internally within the memory device 104, for example. Whether the COPY command is received is determined based on a combination of different input signals to the command decoder. FIG. 3A shows a conceptual diagram of a command decoder 301 as a part of the control logic 206. The command decoder 301 would receive a plurality of input signal which may include a chip select (CS #) input, a row address strobe (RAS #) input, a column address strobe (CAS #) input, a write enable (WE #) input, a special read input, and a special write input. The COPY command is determined based on whether the special read input and the special write input have received its respective predetermined signal.

The CS #input is for activating a subset of the entire memory array (e.g. 201). The RAS #input is for selecting a particular row which could be held open to be subjected to a read operation or a write operation. The CAS #input is for selecting, from a currently selected row, a particular column subjected to a read operation or a write operation. The WE #input is for performing a read operation or a write operation based on whether WE #is held high or low. For example, the WE #input may receive a binary '0' for a read operation and a binary ' 1' for a write operation.

A first predetermined value of the special read input in combination with a second predetermined value of the special write input would determine whether a COPY command has been received. For example, the first predetermined value and the second predetermined value could both be the binary '1' and thus the first predetermined value and the second predetermined value could be the same value. However, they may also be different binary values. If the special read input is not the first predetermined input, other FSMs would be executed. However, if the special read input matches the first predetermined input, another set of FSM would be executed to implement a special read operation to be followed by a special write operation in response to the second determined input having been received. The special read operation includes a normal read operation which reads a block of data to be stored in an output buffer except the data stored in the output buffer is not read by an external controller (e.g. the CPU 101, the memory controller 102 and the DRAM controller 103). The special write operation includes a normal write operation except the data to be written to a different memory location is received from the output buffer.

Figure 3B:
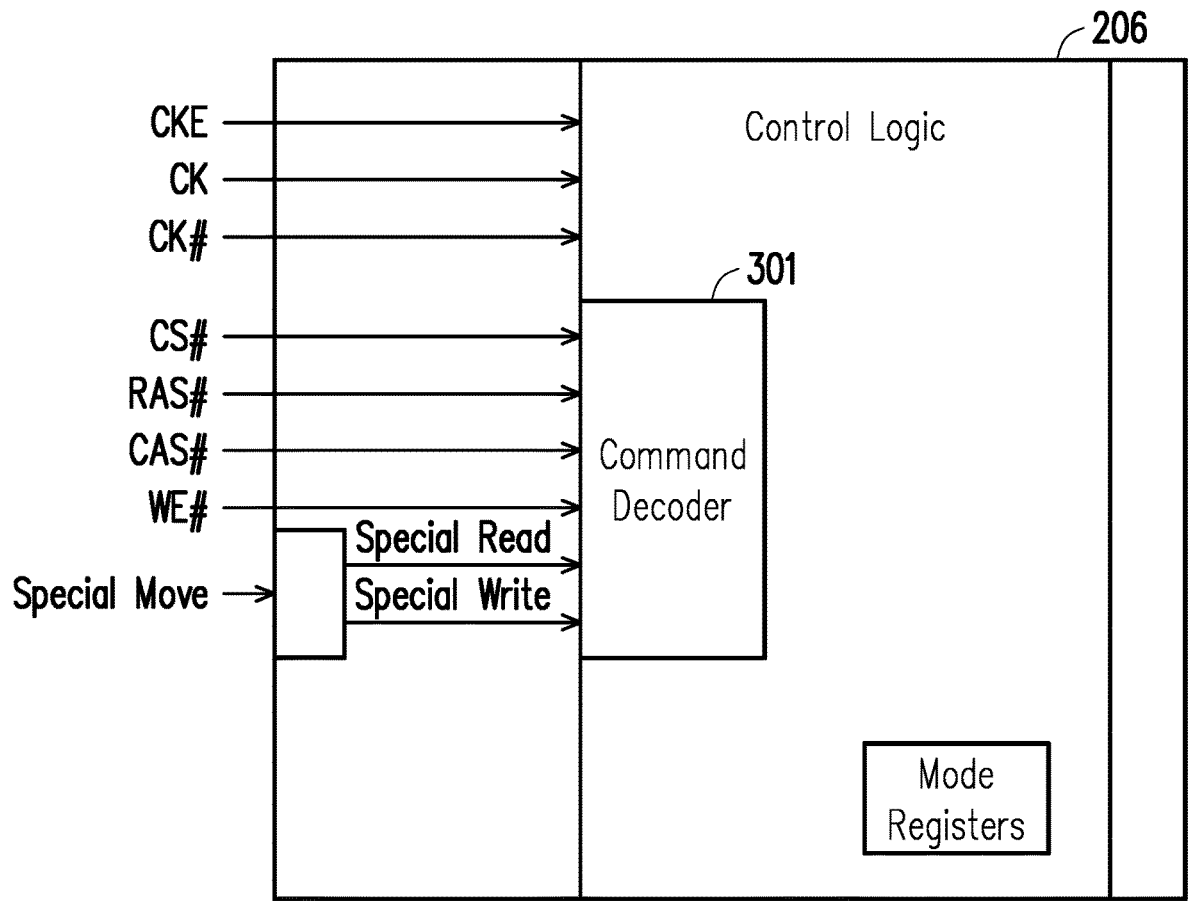
FIG. 3B is alternative embodiment of FIG. 3A of a special move command according to an exemplary embodiment of the disclosure.
Figure 3B:
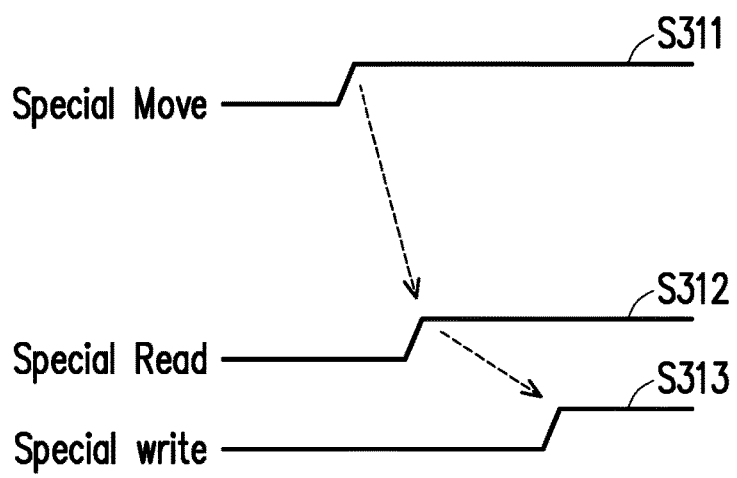

FIG. 3B shows an alternative exemplary embodiment of FIG. 3A. For FIG. 3B, the command decoder 301 may contain an additionally input, namely, a special move command. The special move command could be implemented as an additional I/O or an additional pin of the command decoder 301. The special move command could be automatically decoded by the command decoder 301 as the special read input and the special write input as described above. For example, upon receiving the special move command S311, the command decoder 301 would decode the special move command as a special read input as a high signal and a special write input as a high signal. Next, the special read input as a high signal would trigger a special read operation S312 which would read a block of data in a first memory location and temporarily store the first memory location in an output buffer (e.g. 202). After the block of data is stored in the output buffer (e.g. 202), the special write input would trigger the special write operation which would copy the block of data stored in the output buffer (e.g. 202) to a second memory location. Alternatively, the block of data stored in the output buffer (e.g. 202) could be moved to another temporary location such as a write FIFO buffer (e.g. 709) before being moved to the second memory location.

FIG. 4A is a partial table showing correspondence relationships between input signals and various commands. For example, if the CS #input is low (L), the RAS #input is L, the CAS #input is H, the WE #input is H, then command decoder 301 would decode the set of input signals as an ACTIVE command. Similarly, if the CS #input is low L, the RAS #input is H, the CAS #input is L, the WE #input is H, then command decoder 301 would decode the set of input signals as a READ command. The commands of FIG. 4A would typically further include a PRECHARGE command, an AUTO-REFRESH command, a SELF-REFRESH, a LOAD MODE REGISTER command, and etc. The command decoder 301 would determine that a COPY command has been received if the special read input is H to be followed by the special read input being L. It is worth noting that H corresponds to the binary value '1' and L corresponds to the binary value '0'. However, the disclosure is not limited to the exact formulation of H and L values as shown in FIG. 4A. The various commands stated in FIG. 4A are conventional and well-known commands except for the Copy or Move command which does not previously exist in a conventional command decoder 301.

Upon receiving the ACTIVE command which would typically precede a read operation or a write operation, the memory device would be configured to select a row in the specified bank and activate the word line of a row. Upon receiving the READ command, the memory device would be configured to perform a read operation at a specified column of a row which has been activated. Upon receiving the WRITE command, the memory device is configured to write a block of data to a specified column of a row which has been activated.

Upon receiving the COPY command, the memory device is configured to read a block of data in a first memory location and write the block data in a second memory location. Upon receiving the PRE-CHARGE command, the memory device is configured to per-charge circuits before a read operation or a write operation. Upon receiving the AUTO-REFRESH command, the memory device is configured to restore charges stored in memory cells on a regular basis. Upon receiving the SELF-REFRESH command, the memory device is configured to restore charges stored in memory cells after entering a standby or power saving state.

FIG. 4B is a truth table associated with the special move command. In response to the special move input being a high signal or a binary 1, the command decoder 301 would decode the special move command as a high signal or a binary 1 for the special read input and also a high signal or a binary 1 for the special write input. In response to the special move input being a low signal or a binary 0, the command decoder 301 would decode the special move command as a low signal or a binary 0 for the special read input and also a low signal or a binary 0 for the special write input.

Figure 5:
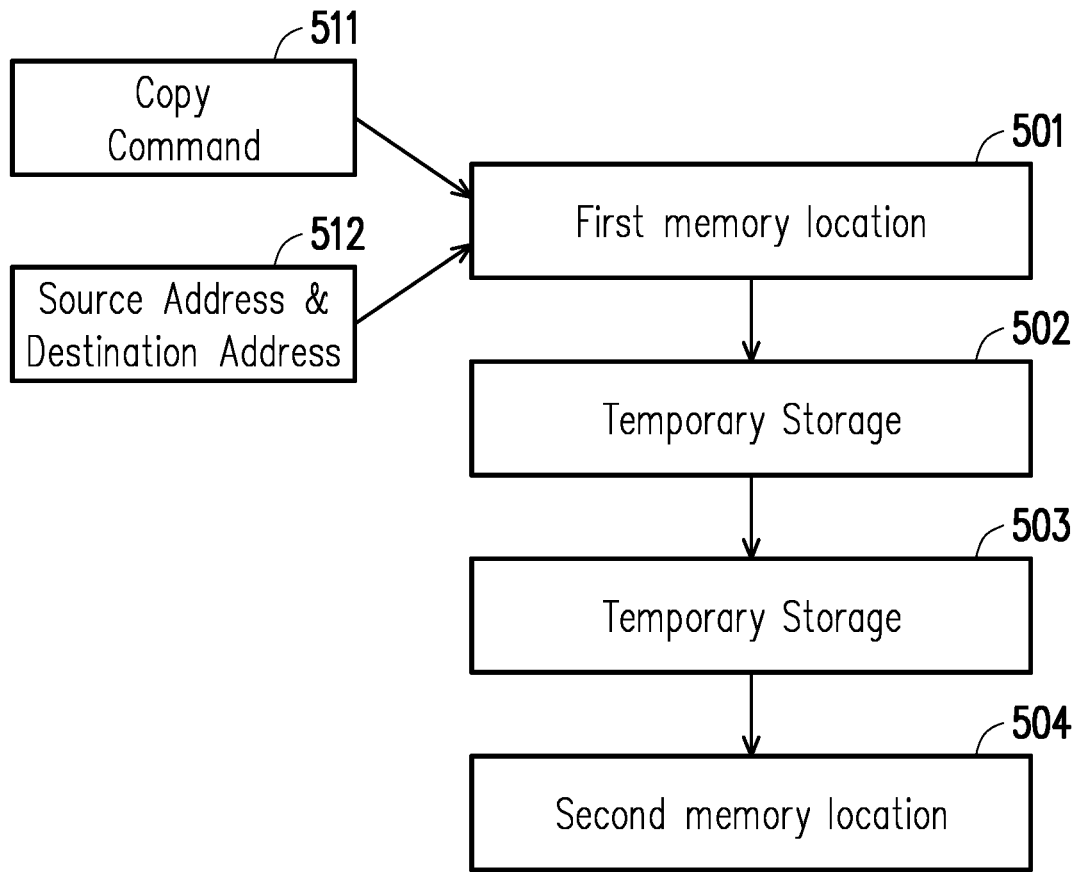
FIG. 5 is a flow chart which illustrates an implementation concept of a copy operation according to an exemplary embodiment of the disclosure.

A conceptual flow chart of a copy operation of a memory device is shown in FIG. 5. In step S511, the memory device would receive a COPY command to perform the copy operation, and in step S512, the memory device would involve receiving a COPY command, a source address, and a destination address. In step S501, the memory device would read a block of data by performing a read operation at the first memory location which corresponds to the source address. In step S502, the memory device would transfer the block of data to a first temporary storage. In order not to impose drastic changes to the current architecture, the temporary storage could be an existing structure such as a read latch of a DRAM. Alternatively, it may also be a dummy row, a temporary buffer, a group of auxiliary cells activated by blowing fuses, and etc. In an optional step S503, the memory device may opt to transfer the block of data to a second temporary storage which could be a write first-in-first-out (FIFO) buffer. The optional step may provide added flexibility to the memory device as more data could be stored and also to resolve potential timing issues. In step S504, the memory device would write the block of data previously stored in the first temporary storage or the second temporary storage to a second memory location.

If the first temporary storage is the read latch and the second temporary storage is the write FIFO buffer, this enables the block of data to be written across different data banks since different data banks would typically be connected through a data line such as a global input output (GIO) data line. If the dummy row technique is used, then it would be more difficult for the block of data to be transferred across different data banks. It is worth noting that the memory device could be a DRAM, a SRAM, RRAM, spin transfer torque magnetoresistive RAM (STT-MRAM), resistive RAM (ReRAM) and/or the like. However, for the sake of explanation, the disclosure would use DRAM architecture as an example to provide further explanations with regard to the inventive concepts.

Figure 6:
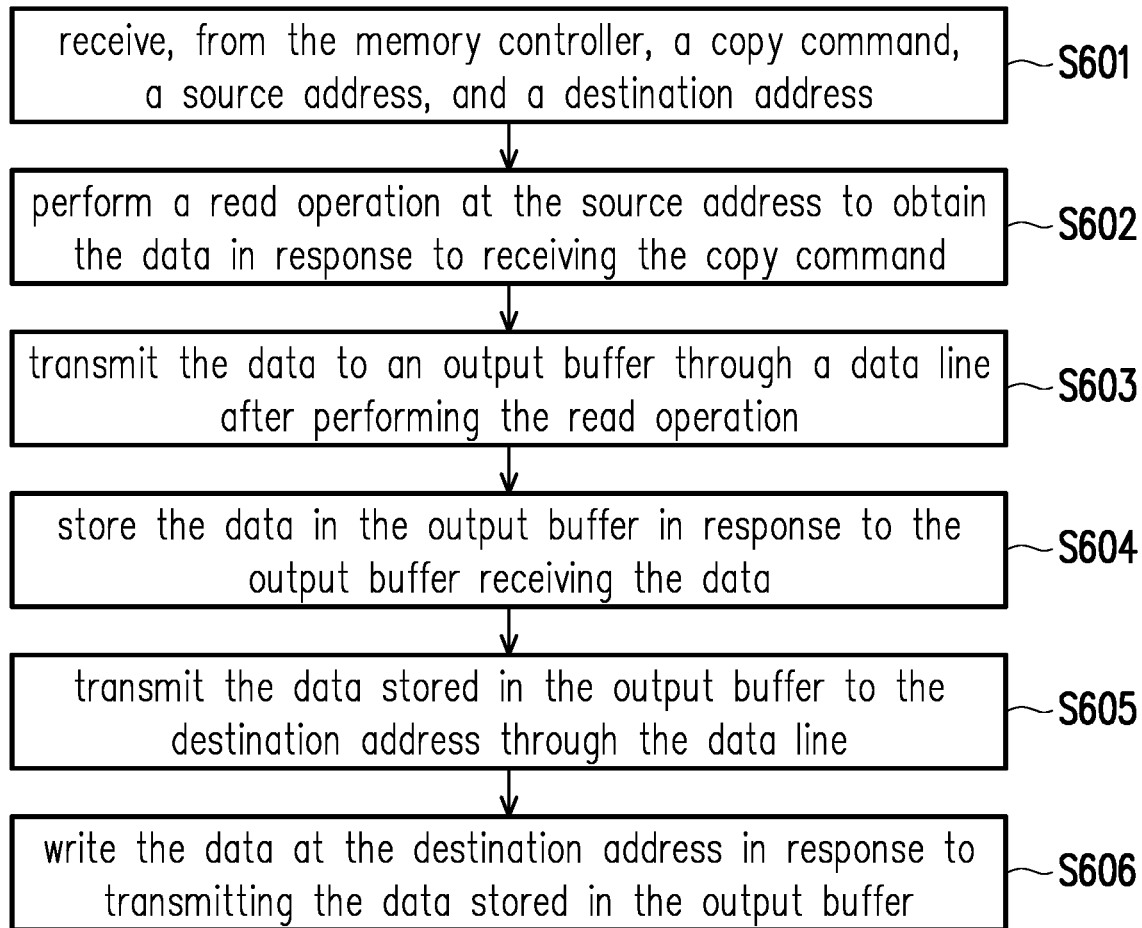
FIG. 6 is a flow chart which illustrates steps of a method of performing a copy operation within a memory device according to an exemplary embodiment of the disclosure.

FIG. 6 is a flow chart which illustrates steps of a method of performing a copy operation within a memory device according to an exemplary embodiment of the disclosure. In step S601, the memory device 104, for example, receiving from a controller (e.g. the CPU 101, the memory controller 102 and the DRAM controller 103), a copy command, a source address, and a destination address, and the source address and the destination address correspond to locations within the memory device. In step S602, the memory device would perform a read operation at the source address to obtain the data in response to receiving the copy command. In step S603, the memory device would transmit the data to an output buffer (e.g. 202) through a GPIO line (e.g. 204) after performing the read operation. In step S604, the memory device would store the data in the output buffer (e.g. 202) in response to the output buffer receiving the data. In step S605, the memory device would transmit the data stored in the output buffer to the destination address through the data line (e.g. 205). In step S606, the memory device would write the data at the destination address in response to transmitting the data stored in the output buffer.

The step of receiving the copy command may include receiving a copy command which is determined based on at least a first predetermined binary value (e.g. '1') received by a special read input (e.g. 302) of the memory device and a second predetermined binary value (e.g. '1') received by a special write input (e.g. 303) of the memory device, and the first predetermined binary value is the same or different from the second predetermined binary value. The memory device may initiate a normal read procedure in response to receiving an active command and the special read input is not the first predetermined binary value (e.g. '0') or initiate a copy procedure corresponding to the copy command in response to receiving the active command and the special read input is the first predetermined binary value. In other words, the memory device would determine whether to execute a normal set of Finite State Machine (FSM) or an alternative FSM based on the values received by the special read input and special write input. The copy procedure corresponding to the copy command may include the normal read procedure and a normal write procedure, and the normal read procedure may include reading from the source address and the normal write procedure may include writing into the destination address.

The step of transmitting the data to the output buffer through the data line after performing the read operation may include transmitting the data from the source address to the output buffer through a first interface (e.g. 203a) connected to the data line in response to the special read input having received the first predetermined binary value. The step of transmitting the data stored in the output buffer to the destination address through the data line may include transmitting the data from the output buffer directly back to the data line to be written into the destination address instead of being received by the memory controller in response to the special write input receiving the second predetermined binary value.

In an alternative exemplary embodiment, the output buffer may include a first interface (e.g. 202a) connected to the data line, a second interface (e.g. 202b) connected to a write driver, and a third interface (e.g. 202c), and the step of transmitting the data stored in the output buffer to the destination address through the data line may include transmitting the data stored in the output buffer directly to the input buffer through the third interface (e.g. 202c), storing the data in the input buffer, and transmitting the data from the input buffer to the destination address. The step of transmitting the data stored in the output buffer directly to the input buffer through the third interface (e.g. 202c) may further include transmitting the data from the input buffer to the destination address without having the data read by the memory controller.

Figure 7:
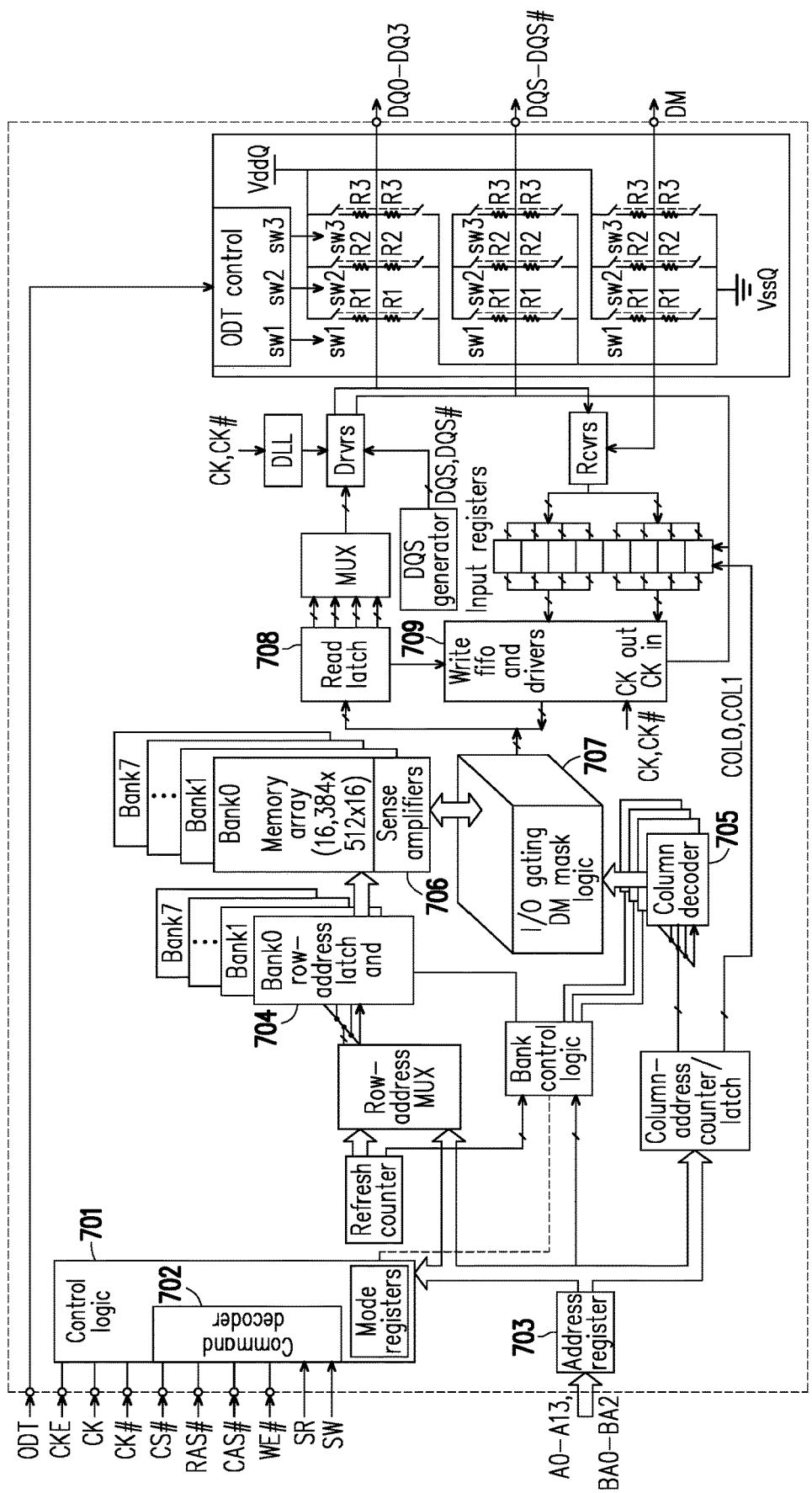
FIG. 7 illustrates a hardware block diagram of a memory device according to an exemplary embodiment of the disclosure.

Since the COPY command includes a combination of the read operation and the write operation, the principle of operation with regard to read operation and the write operation is provided. Referring to FIG. 7 which shows a hardware block diagram of a DRAM memory device, the COPY command commences upon a command decoder 702 of a control logic 701 receiving a READ command and the special read input matching the first predetermined value. An address register 703 would receive a source address which includes a row address and a column address of a first memory location, the row address would be decoded by a row address latch and decoder 704 and the column address would be decoded by a column address decoder 705. Next the column select line (CSL) associated with cells of the resource address of a memory array 706 would be activated so that a block of the data of these selected cells would be sensed by the sense amplifiers, and the block of data is subsequently transmitted to a local input-output (LIO) data line and then to a GIO data line 707 and then latched by an output buffer which is a read latch 708. The block of data which has been read is then stored in the read latch 708.

Next the COPY command would also involve a write operation which commences upon the command decoder 702 of the control logic 701 receiving a WRITE command and the special write input matching the second predetermined value. The address register 703 would receive a destination address which includes a row address and a column address of a second memory location, the row address would be decoded by the row address latch and decoder 704 and the column address would be decoded by the column address decoder 705. The second memory location may receive the block of data stored in the read latch 708 or may receive the block of data stored in the write FIFO buffer 709. Next the CSL associated with cells of the destination address of the memory array 706 would be activated so as to receive the block of the data. Next, the block of data is sent through the GIO data line 707 and to a LIO data line associated with the destination address. Next, the block of data is received by the sense amplifiers which would subsequently transfer the block of data to the bit lines which have been pre-charged and are associated with the cells of the destination address. The write operation would complete as the block of data is written into the cells of the destination address.

Figure 8:
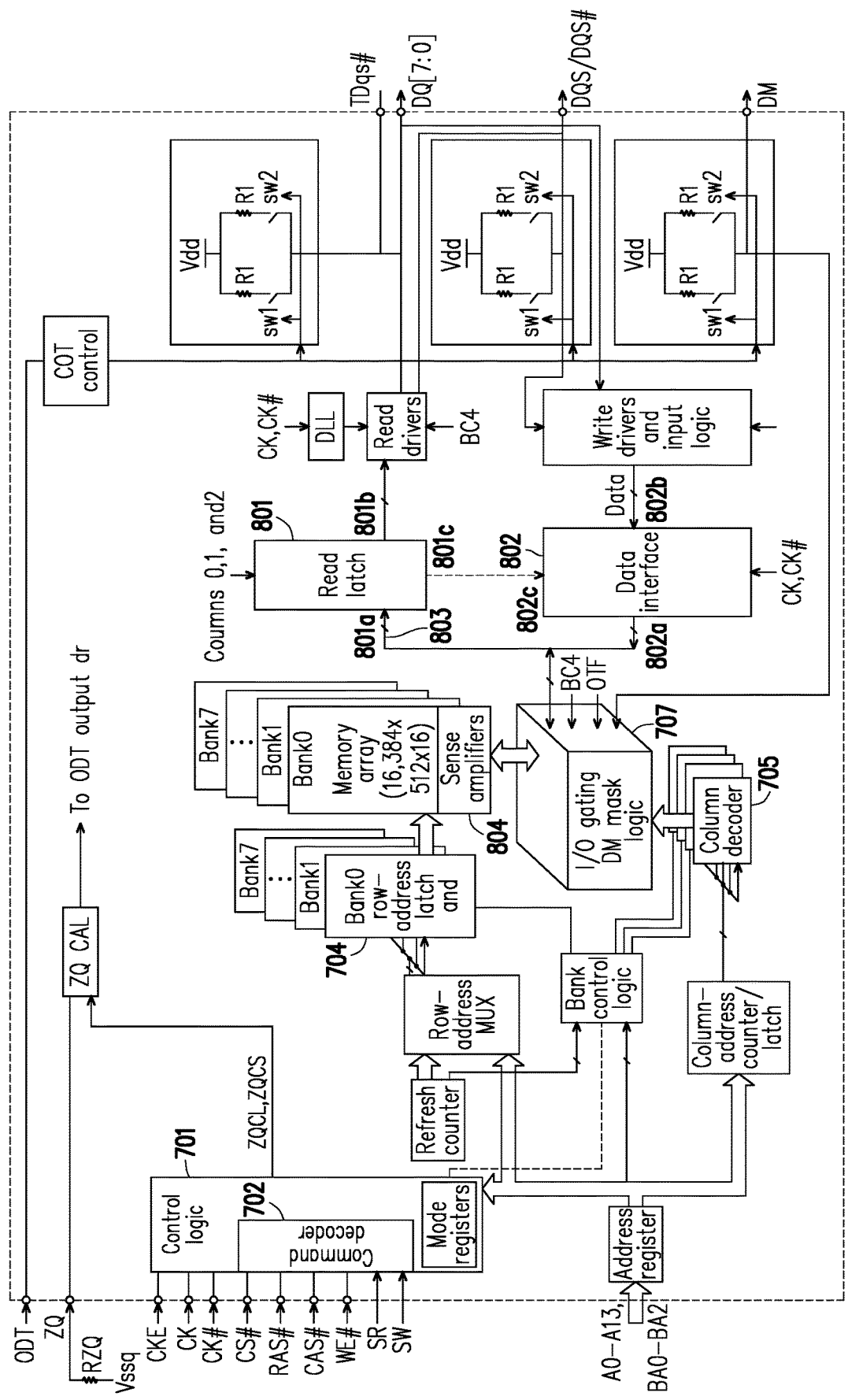
FIG. 8 illustrates a hardware block diagram of a memory device for performing a copy operation according to an exemplary embodiment of the disclosure.

FIG. 8 shows a hardware block diagram of a general memory device for implementing a COPY command. The special read operation described thus far is consistent with a normal read operation except the block of data does not go through a parallel to serial transformation and is not sent out to be received by an external controller (e.g. the CPU 101, the memory controller 102 and the DRAM controller 103). Conventionally, the block of data would have undergone a parallel to serial transformation by the read latch 801 to transform the bits of the block data from a parallel format to a serial format, but for the disclosure, the block of data is transferred back to the memory array to be moved or copied. In other words, the read operation is performed except that the output stops at a read latch 801 which includes a first interface 801a and a second interface 801b. The first interface 801a is connected to and receives data from the GIO data line 803. The second interface 801b is connected to a read driver, but the block of data would not be received by an external controller through the read driver.

Further, the special write operation described thus far is consistent with a normal write operation except the block of data is received from the read latch 801 to be written back to the memory array through a GIO data line 803 and the LIO data line associated with the destination address. Or alternatively, the read latch 801 may further include a third interface 801c so that the block of data could be received directly from a write FIFO buffer 802 to be written back to the memory array through the GIO data line 803 and the LIO data line associated with the destination address. Or alternatively, the block of data could be transferred from the read latch 801 to the write FIFO buffer 802 through the GIO data line. The write FIFO buffers 802 has not limited to a first interface 802a which is connected to the GIO data line 803 for transmitting data to the GIO data line 803, a second interface 802b for receiving data from a write driver, and optionally a third interface 802c for receiving data directly from the read latch 801.

It is also worth noting that concepts relate to the procedures of the COPY command would also be applicable to memory devices other than the DRAM memory device except that memory devices SRAM, RRAM, Flash memory, and the like do not require sense amplifiers to perform the read operation and the write operation. In other words, even though some memory devices don't use sense amplifiers, it would be apparent to an ordinary person skilled in the art to make the necessary adjustments to implement the techniques provided in this disclosure. In general, the aforementioned concepts of the disclosure is suitable for being used in or as a part of an electronic device and is able to perform a copy or a move operation to copy data from a memory location to another memory location without having to transfer the data to a central processor through a memory controller. The advantages or benefits or improvements to the industry would include the ability to implement a COPY command without having to impose drastic changes upon the current memory device architecture. Also, the locations involved in the COPY command could be flexible as the locations could be within the same or different sections, within the same memory bank, or between different memory banks.

Figure 9A:
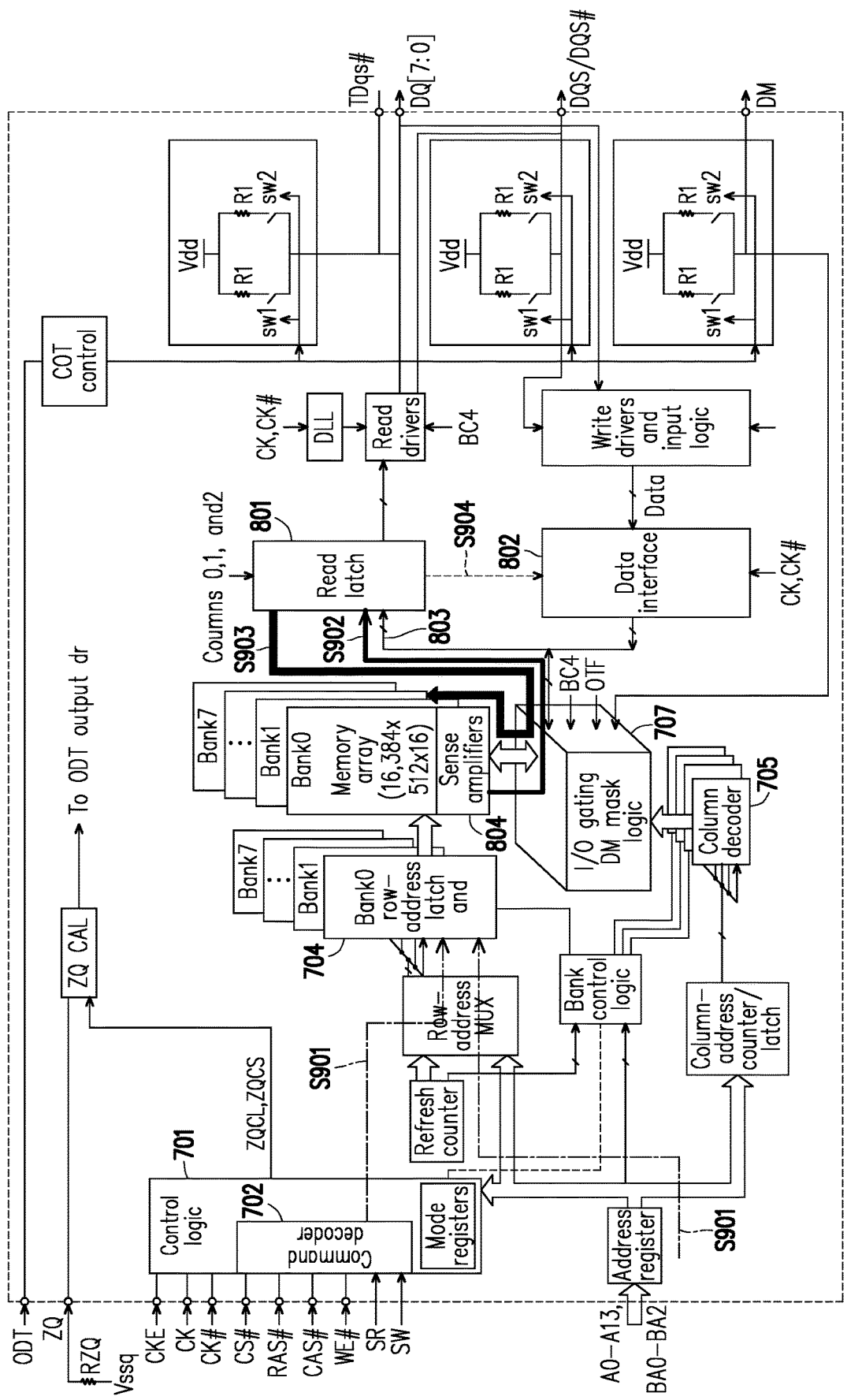
FIG. 9A illustrates performing a copy operation according to a first exemplary embodiment of the disclosure.

To further elucidate the concepts provided thus far, the disclosure further provides several exemplary embodiments of implementing the COPY command for a double data rate (DDR) 3256 Mb×8 memory device and its associated FSM. FIG. 9A illustrates a first exemplary embodiment implementing the COPY command for a single block of data. The COPY command would copy a single block of data with a size of M bits stored in cells associated with a source address into cells associated with a destination address where M is an integer greater than 0 such as 64. In step S901, the rows of cells associated with the source address in which the single block of data is stored is activated. In step S902, the single block of data stored in the cells associated with the source address is read and transferred to the read latch. In step S903, the single block of data stored in the read latch (i.e. output buffer) is written into cells associated with the destination address. The source address and the destination address could be addresses of the same bank or of different banks. Alternative to step S903, for step S904, the single block of data stored in the read latch could be transferred from the read latch to the write FIFO buffer (i.e. input buffer) and then subsequently written into cells associated with the destination address. By using the embodiment of FIG. 9A of the disclosure, the COPY command could be utilizes to copy a single block of data stored in the read latch or output buffer (e.g. 202) and directly copied back into the memory array (e.g. 201) instead of outputting the single block of data to an external processor first before copying back into the memory array 201.

Figure 9B:
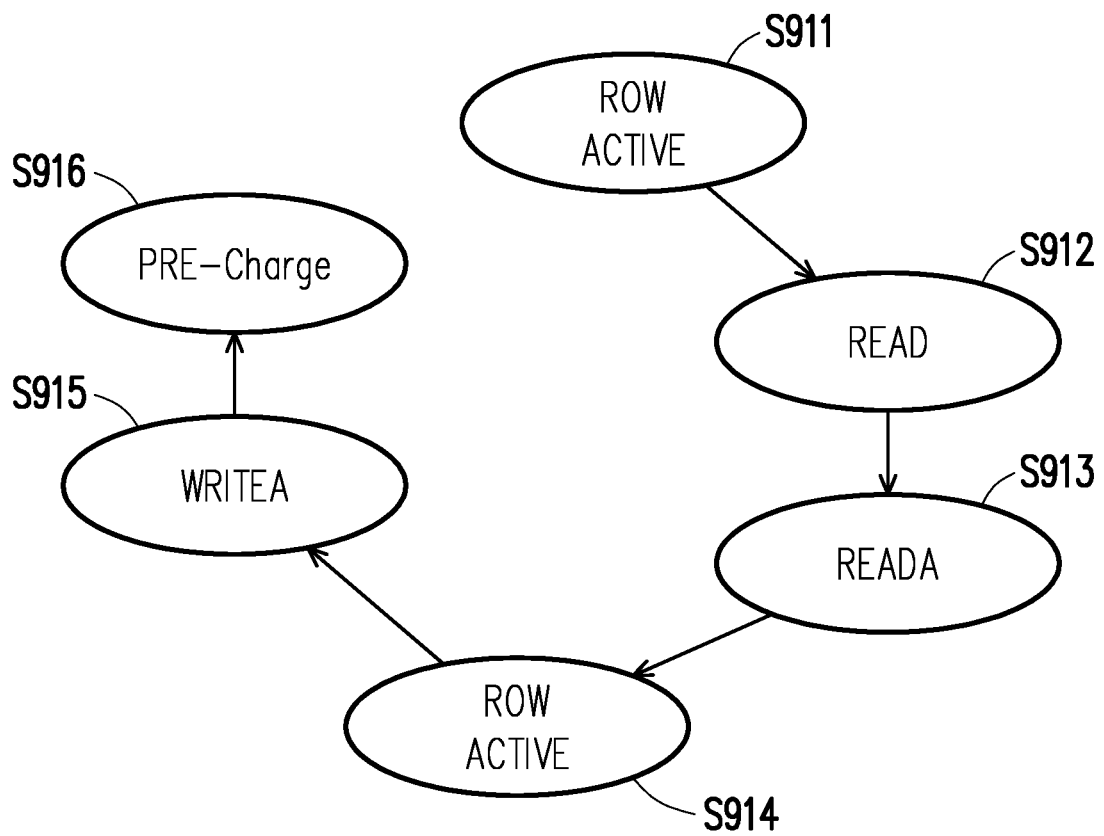
FIG. 9B illustrates a finite state machine related to the copy operation according to the first exemplary embodiment of the disclosure.

FIG. 9B illustrates an FSM diagram related to the example of FIG. 9A. In step S911, memory control device would activate the rows of cells associated with the source address where the single block of data has been stored. In response to the cells having been activated, in step S912, a read operation would be performed for the cells associated with the source address to obtain the single block of data which would be transferred through a GIO data line to be stored in a read latch or output buffer (e.g. 202). After the single block of data has been stored in the read latch, in step S913, a read operation would be performed in the read latch in order to transfer the single block of data to be written in cells associated with the source address. In step S914, the memory control device would activate rows of cells associated with the destination address where the single block of data is to be written to. In response to the cells having been activated, in step S915, the single block of data is written into cells associated with the destination address. In step S916, a pre-charge operation is performed for the next iteration of a read or a write operation. By using the embodiment of FIG. 9B of the disclosure, the COPY command could be implemented by copying a single block of data from an output buffer (e.g. 202) back into the destination address.

Figure 10:
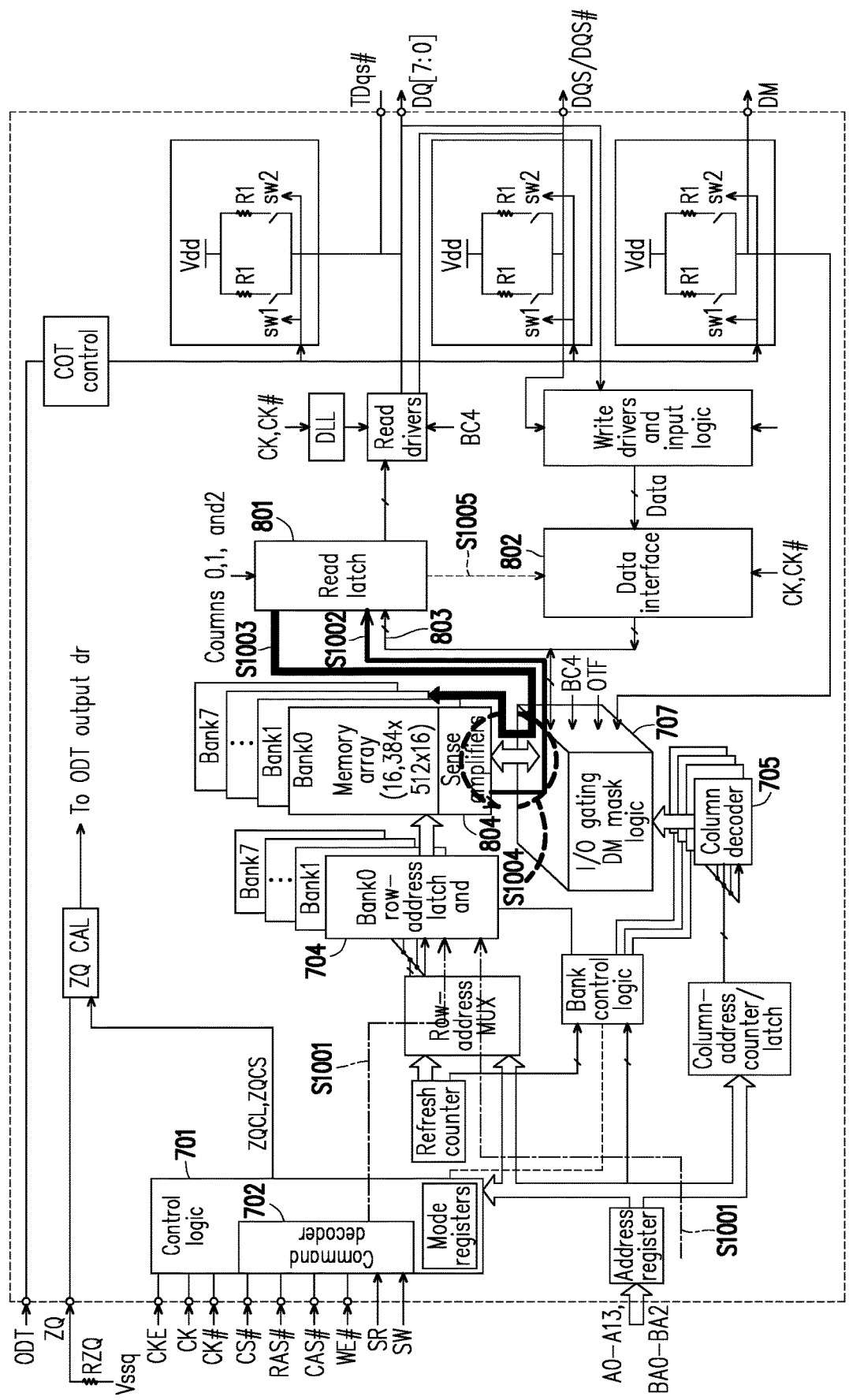
FIG. 10 illustrates performing a copy operation related to the copy operation according to a second exemplary embodiment of the disclosure.

FIG. 10 illustrates a second exemplary embodiment of implementing the COPY command for multiple blocks of data. The COPY command would copy N blocks of data with each block of data having a size of M bits stored in cells associated with a source address into cells associated with a destination address. N is an integer greater than one, and M is an integer greater than zero, such as 64. The source address and the destination address are located in the same row of the same data bank but located in different columns. In step S1001, the word lines of cells associated with the source address in which one of the multiple blocks of data has been stored is activated, and subsequently, one of the multiple blocks of data is read from one or more columns of the same row. In step S1002, one of the multiple blocks of data stored in the cells associated with the source address is transferred to the read latch. Steps S1001 and S1002 are repeated N−1 times until all of the multiple blocks of data which belongs to the same row are transferred to the read latch. In step S1003, one of the multiple blocks of data of the same row stored in the read latch (i.e. output buffer) is transferred through the GIO and subsequently written into cells associated with the destination address which belongs to the same row but is located in a different column.

Also, for the second exemplary embodiment, the source address and the destination address are assumed to be in the same memory bank. In step S1004, steps S1001-S1003 could be repeated for the rest of the multiple blocks of data of the same row until all of the multiple blocks of data has been stored in cells associated with the destination address.

Alternative to step S1003, for step S1005, one or more of the multiple blocks of data stored in the read latch could be transferred from the read latch to the write FIFO buffer (i.e. input buffer) and then subsequently written into cells associated with the destination address. By using the embodiment of FIG. 10 of the disclosure, the COPY command could be utilizes to copy a single block of data stored in the read latch or output buffer (e.g. 202) and directly copied back into the memory array (e.g. 201) instead of outputting the single block of data to an external processor first before copying back into the memory array 201, and the COPY command could be implemented at a manner that the single block of data is copied from the source address of a column into the destination address in a different column but in the same row.

Figure 11:
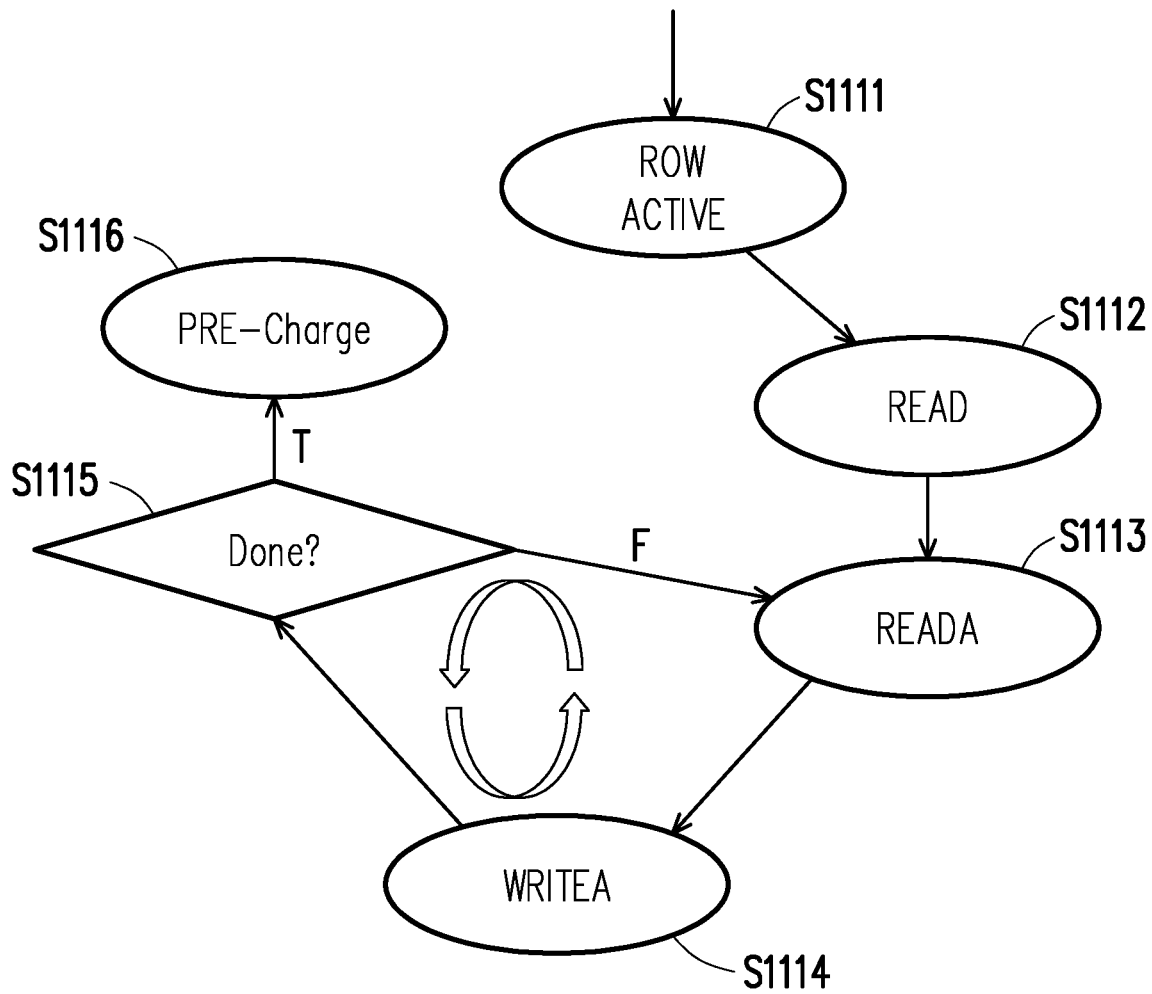
FIG. 11 illustrates a finite state machine related to according to the second exemplary embodiment of the disclosure.

FIG. 11 illustrates an FSM diagram related to the example of FIG. 10. In step S1111, memory control device would activate the word lines of cells associated with the source address where the one of multiple blocks of data is to be stored. In response to the cells having been activated, in step S1112, a read operation would be performed for the cells associated with the source address to obtain one the multiple blocks of data which would be transferred through a GIO data line to be stored in a read latch. After the single block of data has been stored in the read latch, in step S1113, a read operation would be performed in the read latch in order to transfer the single block of data to be written in cells associated with the source address. In step S1114, the memory control device would write the single block of data into cells associated with the destination address. In step S1115, the memory control device would determine whether all of the multiple blocks of data are written into cells associated with the destination address. If yes, then in step S1116, a pre-charge operation is performed for the next iteration of a read or a write operation; otherwise, step S1113 is repeated. By using the embodiment of FIG. 11 of the disclosure, the COPY command could be utilizes to copy multiple blocks of data stored in the read latch or output buffer (e.g. 202) and directly copied back into the memory array (e.g. 201) instead of outputting the single block of data to an external processor first before copying back into the memory array 201, and the COPY command could be implemented at a manner that a single block of data of the multiple blocks of data is copied from the source address of a column into the destination address in a different column but in the same row as described between steps S1113 and S1115 until the copy or move operation for all the multiple blocks of data are completed.

Figure 12:
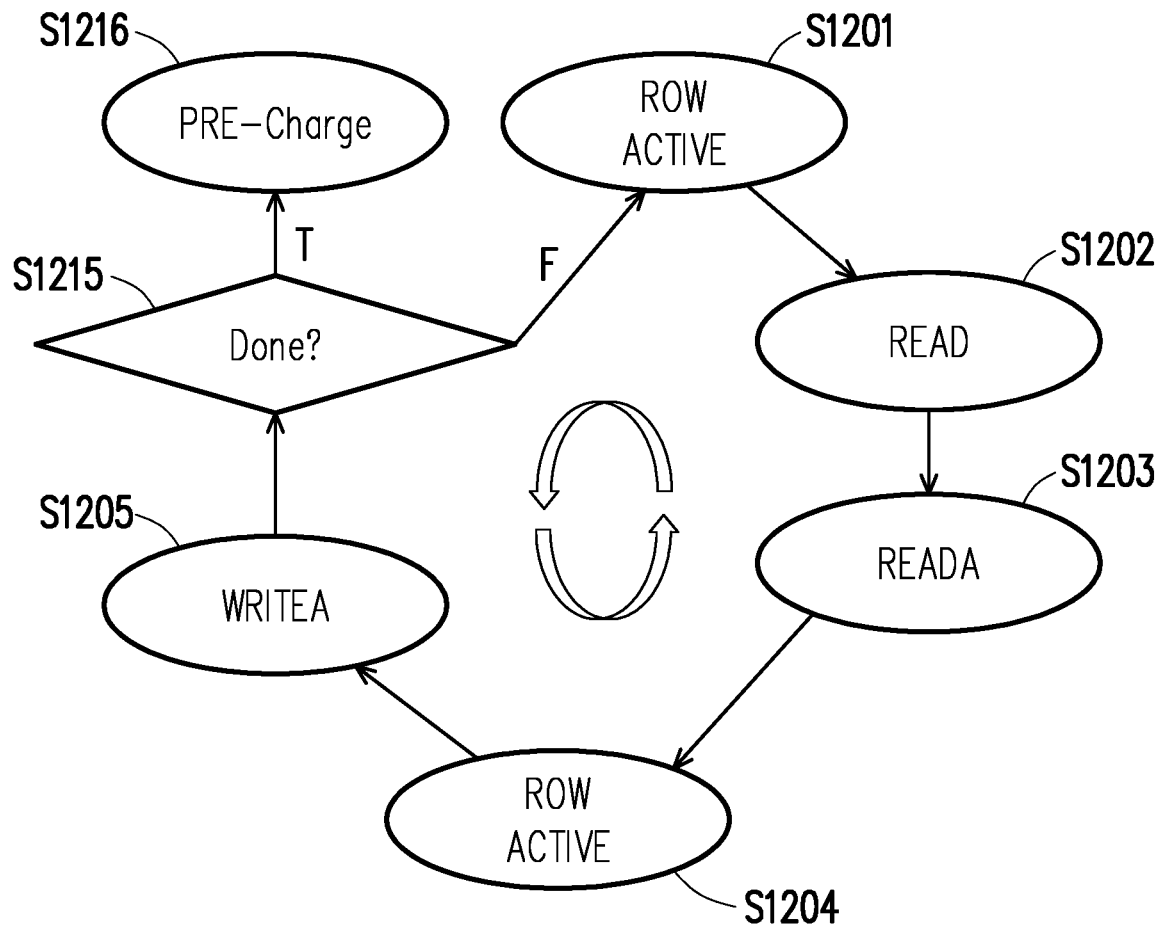
FIG. 12 illustrates a finite state machine related to according to the third exemplary embodiment of the disclosure.

FIG. 12 illustrates a third exemplary embodiment of implementing the COPY command for multiple blocks of data. The difference between the third exemplary embodiment of FIG. 12 and the second exemplary embodiment of FIG. 11 includes that for the third embodiment, the source address and the destination address are located in different rows but in the same column of the same data bank whereas but for the second exemplary embodiment of FIG. 11, the source address and the destination address are located the same rows but different column of the same data bank. Since the source address and the destination address are located in different rows, each of the rows corresponding to the source address and the destination address has to be separately activated. The third exemplary embodiment of FIG. 12 could be understood together with the hardware diagram of FIG. 10. Referring back to FIG. 10 which is also applicable to the third exemplary embodiment, first the word lines of cells associated with the source address. In step S1001, the word lines of cells associated with the source address from a row in which one of the multiple blocks of data has been stored is activated, and subsequently, the one of the multiple blocks of data is read from the same row. In step S1002, the one of the multiple blocks of data from the same row associated with the source address is transferred to the read latch. In step S1003, one of the multiple blocks of data stored in the read latch (i.e. output buffer) is transferred through the GIO and subsequently written into cells associated with the destination address located in a different row which is subsequently activated. In step S1104, steps S1001-S1003 could be repeated for N−1 times until the rest of the multiple blocks of data has been stored in cells associated with the destination address. Alternative to step S1103, for step S1105, one or more of the multiple blocks of data stored in the read latch could be transferred from the read latch to the write FIFO buffer (i.e. input buffer) and then subsequently written into cells associated with the destination address.

Now referring to FIG. 12 which illustrates an FSM related to the third exemplary embodiment In step S1201, memory control device would activate the word lines of cells of a row associated with the source address where the one of multiple blocks of data is to be stored. In response to the cells having been activated, in step S1202, a read operation would be performed for the cells associated with the source address to obtain one of the multiple blocks of data of the same row which would be transferred through a GIO data line to be stored in a read latch. After the one of the multiple blocks of data of the same row has been stored in the read latch, in step S1203, a read operation would be performed in the read latch in order to transfer the one of the multiple blocks of data of the same row to be written in cells associated with the source address. In step S1204, the memory control device would activate another row of cells associated with the destination address where the one the multiple blocks will be stored. The cells in the destination address are located in a different row relative to the source address. In step S1204, the one the multiple blocks will be written into cells associated with the destination address. In step S1206, the memory control device would determine whether all of the multiple blocks of data are written into cells associated with the destination address. Yes, so, then in step S1207, a pre-charge operation is performed for the next iteration of a read or a write operation; otherwise, step S1201 is repeated. In comparison to the second exemplary embodiment, the third exemplary embodiment has an additional step of row activation since the source address and the destination are located in different rows. Also, for second exemplary embodiment, a row is activated once until all the columns of the row are finished moving before a pre-charge operation, but for the third exemplary embodiment, all of the multiple blocks of data located in a row are copied to another row before a pre-charge operation. By using the embodiment of FIG. 12 of the disclosure, the COPY command could be utilizes to copy multiple blocks of data stored in the read latch or output buffer (e.g. 202) and directly copied back into the memory array (e.g. 201) instead of outputting the single block of data to an external processor first before copying back into the memory array 201, and the COPY command could be implemented at a manner that multiple blocks of data stored in some rows are copied from the source address into different rows of the destination address as described between steps S1201 and S1205 until the copy or move operation of all the multiple blocks of data are completed.

Figure 13:
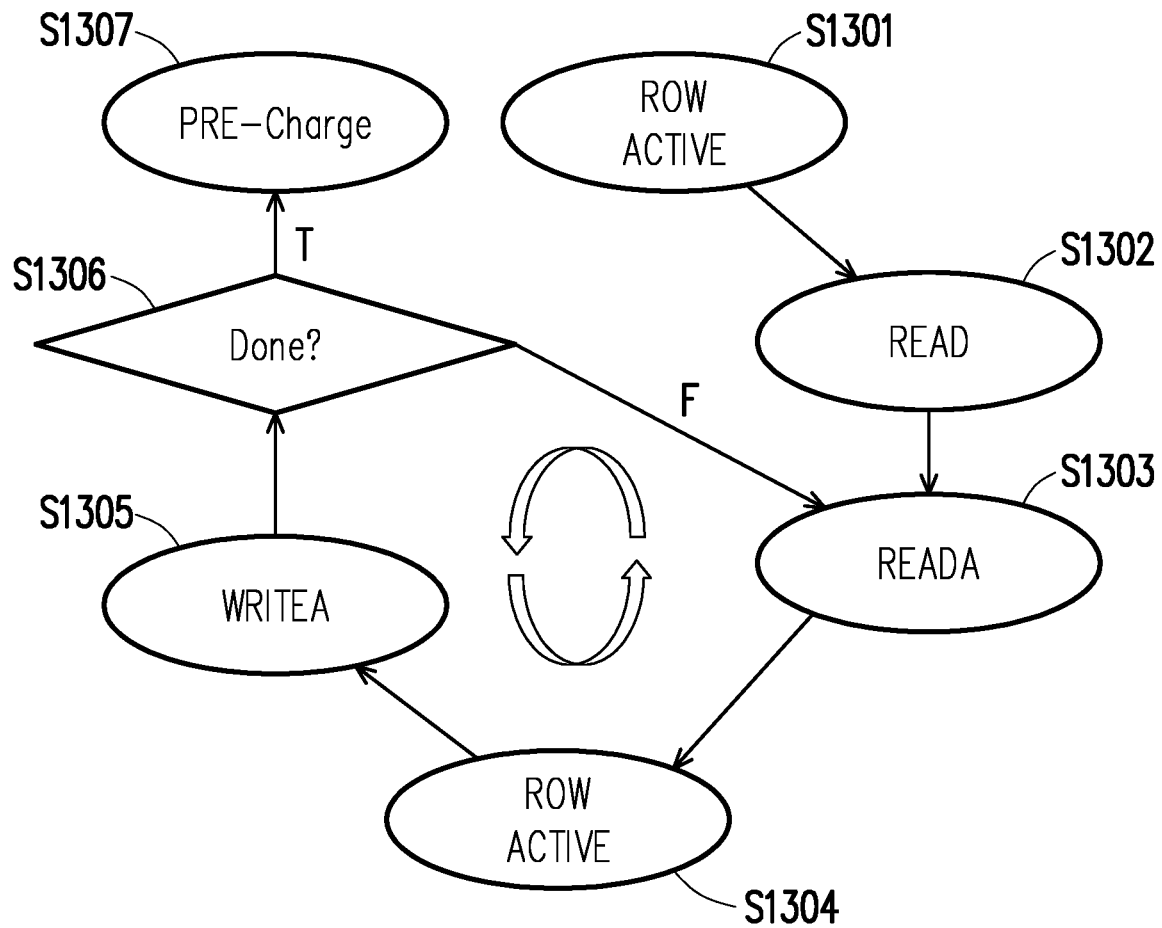
FIG. 13 illustrates a finite state machine related to according to the fourth exemplary embodiment of the disclosure.

FIG. 13 illustrates a fourth exemplary embodiment of implementing the COPY command for multiple blocks of data. The COPY command would copy N blocks of data stored in M columns of one row with each block of data having a size of M bits stored in cells associated with a source address into cells associated with a destination address and to be stored in multiple rows, where M is an integer greater than 0 such as 64. Referring back to FIG. 10 which is also applicable to this exemplary embodiment, in step S1001, the word lines of cells associated with the source address of a row in which multiple blocks of data located in multiple columns of the row are to be copied into multiple rows where each of the multiple rows is associated with a destination address. In step S1002, the multiple blocks of data stored in the cells of the multiple columns of the same row associated with the source address is transferred to the read latch. In step S1003, the multiple blocks of data stored in the read latch (i.e. output buffer) are transferred through the GIO and subsequently written into cells associated with the destination address into different rows. In step S1004, one iteration of steps S1001-S1003 could be repeated until the rest of the multiple blocks of data has been stored in cells associated with one row of the destination address, and multiple iterations are performed per row. Alternative to step S1203, for step S1205, one or more of the multiple blocks of data stored in the read latch could be transferred from the read latch to the write FIFO buffer (i.e. input buffer) and then subsequently written into cells associated with the destination address.

Referring to FIG. 13 which illustrates an FSM diagram related to the fourth exemplary embodiment. In step S1301, the word lines of cells of a row associated with the source address in which multiple blocks of data having been stored multiple columns of the row are activated. In step S1302, the multiple blocks of data stored in the multiple columns associated with the row of the source address is transferred to the read latch.

In step S1303, the multiple blocks of data stored in the read latch (i.e. output buffer) is transferred through the GIO in order to be written into a first row of cells associated with the destination address. In step S1304, the memory control device would activate the first row of cells associated with the destination address where the one the multiple blocks will be stored. In step S1305, the one the multiple blocks is written into the first row of cells associated with the destination address. In step S1306, the memory control device would determine whether the one of the multiple blocks of data are written into cells associated with the first row of the destination address. If yes, then in step S1307, a pre-charge operation is performed for the next iteration of a read or a write operation; otherwise, step S1303 is repeated for another block of data to be written into a second row of cells associated with the destination address. Steps S1303-S1306 could be repeated for a second row where another one of the multiple blocks are data is to be stored. Steps S1303-S1306 could be repeated multiple times until the rest of the multiple blocks of data has been stored in cells of multiple rows associated with the destination address. By using the embodiment of FIG. 13 of the disclosure, the COPY command could be utilizes to copy multiple blocks of data stored in the read latch or output buffer (e.g. 202) and directly copied back into the memory array (e.g. 201) instead of outputting the single block of data to an external processor first before copying back into the memory array 201, and the COPY command could be implemented at a manner that multiple columns of data in one row is copied from the source address into the destination address to multiple rows between steps S1303 and S1306 until the copy or move operations for all of the multiple blocks of data are completed.

In some embodiments of the present disclosure, a memory device is provided. The memory device includes a command decoder configured to receive a copy command to copy data stored in a first memory location to a second memory location without transmitting the data to an external controller, a memory array electrically connected to the command decoder and including a plurality of memory locations including the first memory location and the second memory location, a data line electrically connected to the memory array and configured to receive, from the first memory location, the data to be transmitted to the second memory location through the same data line, and an output buffer configured to store the data received from the first memory location through the data line to be written into the second memory location without transmitting the data to the external controller.

According to an exemplary embodiment, the command decoder includes a special read input and a special write input as the copy command is determined based on at least a first predetermined binary value received by the special read input and a second predetermined binary value received by the special write input, through the first predetermined binary value is the same or different from the second predetermined binary value.

According to an exemplary embodiment, the memory device further include a control logic which is configured to initiate a normal read procedure in response to receiving an active command and the special read input is not the first predetermined binary value, and to initiate a copy procedure corresponding to the copy command in response to receiving the active command and the special read input is the first predetermined binary value.

According to an exemplary embodiment, the copy procedure corresponding to the copy command includes the normal read procedure and a normal write procedure, wherein the normal read procedure includes reading from the first memory location and the normal write procedure includes writing into the second memory location.

According to an exemplary embodiment, the output buffer includes a first interface connected to the data line and a second interface connected to a read driver as the data is received by the output buffer in response to the special read input receiving the first predetermined binary value.

According to an exemplary embodiment, the control logic is configured to control the output buffer to output the data directly back to the data line to be written into the second memory location instead of being received by the external controller in response to the special write input receiving the second predetermined binary value.

According to an exemplary embodiment, the memory device further includes an input buffer which includes a first interface connected to the data line, a second interface connected to a write driver, and a third interface connected to the output buffer.

According to an exemplary embodiment, the control logic is configured to control the input buffer to receive the data transferred from the output buffer directly through the third interface and to output the data to the data line to be written into the second memory location without transmitting the data to an external controller.

In some embodiments of the present disclosure, a method of copying data within a memory device without transmitting the data to a memory controller is described. The method would include but not limited to receiving, from the memory controller, a copy command, a source address, and a destination address, wherein the source address and the destination address correspond to locations within the memory device, performing a read operation at the source address to obtain the data in response to receiving the copy command, transmitting the data to an output buffer through a data line after performing the read operation, storing the data in the output buffer in response to the output buffer receiving the data, transmitting the data stored in the output buffer to the destination address through the data line, and writing the data at the destination address in response to transmitting the data stored in the output buffer.

According to an exemplary embodiment, receiving the copy command includes receiving the copy command which is determined based on at least a first predetermined binary value received by a special read input of the memory device and a second predetermined binary value received by a special write input of the memory device, and the first predetermined binary value is the same or different from the second predetermined binary value.

According to an exemplary embodiment, the method further include initiating a normal read procedure in response to receiving an active command and the special read input is not the first predetermined binary value, and initiating a copy procedure corresponding to the copy command in response to receiving the active command and the special read input is the first predetermined binary value.

According to an exemplary embodiment, the copy procedure corresponding to the copy command includes the normal read procedure and a normal write procedure, wherein the normal read procedure includes reading from the source address and the normal write procedure includes writing into the destination address.

According to an exemplary embodiment, transmitting the data to the output buffer through the data line after performing the read operation would include transmitting the data from the source address to the output buffer through a first interface connected to the data line in response to the special read input having received the first predetermined binary value.

According to an exemplary embodiment, transmitting the data stored in the output buffer to the destination address through the data line would include transmitting the data from the output buffer directly back to the data line to be written into the destination address instead of being received by the memory controller in response to the special write input receiving the second predetermined binary value.

According to an exemplary embodiment, the output buffer includes a first interface connected to the data line, a second interface connected to a write driver, and a third interface, and transmitting the data stored in the output buffer to the destination address through the data line would include transmitting the data stored in the output buffer directly to the input buffer through the third interface, storing the data in the input buffer, and transmitting the data from the input buffer to the destination address.

According to an exemplary embodiment, transmitting the data stored in the output buffer directly to the input buffer through the third interface further would include transmitting the data from the input buffer to the destination address without having the data read by the controller.

In some embodiments of the present disclosure, an electronic device is provided The electronic device includes a controller, and a memory device electrically connected to the controller, wherein the memory device includes a command decoder configured to receive a copy command to copy data stored in a first memory location to a second memory location without transmitting the data to the controller, a memory array electrically connected to the command decoder and including a plurality of memory locations including the first memory location and the second memory location, a data line electrically connected to the memory array and configured to receive, from the first memory location, the data to be transmitted to the second memory location through the same data line, and an output buffer configured to store the data received from the first memory location through the data line to be written into the second memory location without transmitting the data to the controller.

According to an exemplary embodiment, the command decoder includes a special read input and a special write input as the copy command is determined based on at least a first predetermined binary value received by the special read input and a second predetermined binary value received by the special write input. The first predetermined binary value could be the same or different from the second predetermined binary value.

According to an exemplary embodiment, the output buffer includes a first interface connected to the data line and a second interface connected to a read driver as the data is received by the output buffer in response to the special read input receiving the first predetermined binary value, and the output buffer is configured to output the data directly back to the data line to be written into the second memory location instead of being received by the controller.

According to an exemplary embodiment, the electronic device would further include an input buffer which includes a first interface connected to the data line, a second interface connected to a write driver, and a third interface connected to the output buffer, and the input buffer is configured to receive the data transferred from the output buffer directly through the third interface so as to output the data to the data line to be written into the second memory location without transmitting the data to the memory controller.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the present disclosure. In view of the foregoing, it is intended that the disclosure cover modifications and variations of this disclosure provided they fall within the scope of the following claims and their equivalents.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device comprising:
a memory array comprising a first memory location and a second memory location;
a data line electrically connected to the memory array and configured to receive, from the first memory location, the data to be transmitted to the second memory location through the same data line in response to a copy command;

an output buffer connected to a read driver and configured to store the data received from the first memory location through the data line to be written directly into the second memory location in response to the copy command; and an input buffer connected to a write driver and configured to receive the data transferred from the output buffer, wherein the output buffer is a read latch.

2. The memory device of claim 1, wherein the memory device further comprises:

a command decoder configured to receive the copy command to copy data stored in the first memory location directly to the second memory location, wherein the command decoder comprising a special read input and a special write input as the copy command is determined based on at least a first predetermined binary value received by the special read input and a second predetennined binary value received by the special write input.

3. The memory device of claim 2 further comprising:

a control logic configured to:
initiate a noiliial read procedure in response to receiving an active command and the special read input is not the first predeteii lined binary value; and
initiate a copy procedure corresponding to the copy command in response to receiving the active command and the special read input is the first predetermined binary value.

4. The memory device of claim 3, wherein the copy procedure corresponding to the copy command comprises the normal read procedure and a normal write procedure, wherein the normal read procedure comprises reading from the first memory location and the normal write procedure comprises writing into the second memory location.

5. The memory device of claim 2, wherein output buffer comprises a first interface connected to the data line and a second interface connected to the read driver as the data is received by the output buffer in response to the special read input receiving the first predetermined binary value.

6. The memory device of claim 5, wherein the output buffer is configured to store the data received from the first memory location through the data line to be written into the second memory location comprising:

a control logic is configured to control the output buffer to output the data directly back to the data line to be written into the second memory location instead of being received by an external controller in response to the special write input receiving the second predetermined binary value.

7. The memory device of claim 1 further comprising:

the input buffer which comprises a first interface connected to the data line, a second interface connected to the write driver, and a third interface connected to the output buffer.

8. The memory device of claim 7, wherein the output buffer is configured to store the data received from the first memory location through the data line to be written into the second memory location comprising:

a control logic is configured to control the input buffer to receive the data transferred from the output buffer directly through the third interface and to output the data to the data line to be written into the second memory location without transmitting the data to an external controller.

9. A method of copying data within a memory device, the method comprising:

perfolining a read operation at a source address to obtain the data in response to a copy command;

transmitting the data to an output buffer through a data line after performing the read operation, wherein the output buffer is connect to a read driver;

storing the data in the output buffer in response to the output buffer receiving the data;

transmitting the data stored in the output buffer to a destination address through the data line;

transmitting the data stored in the output buffer directly to an input buffer, wherein the input buffer is connect to a write driver; and writing the data at the destination address in response to transmitting the data stored in the output buffer, wherein the output buffer is a read latch.

10. The method of claim 9, further comprising:

receiving, from a memory controller, the copy command, the source address, and the destination address, wherein the source address and the destination address correspond to locations within the memory device;

performing the read operation at the source address to obtain the data in response to receiving the copy command, wherein receiving the copy command comprises:

receiving the copy command which is determined based on at least a first predetermined binary value received by a special read input of the memory device and a second predetermined binary value received by a special write input of the memory device, and the first predetermined binary value is the same or different from the second predetermined binary value.

11. The method of claim 10 further comprising:

initiating a normal read procedure in response to receiving an active command and the special read input is not the first predetermined binary value; and initiating a copy procedure corresponding to the copy command in response to receiving the active command and the special read input is the first predetermined binary value.

12. The method of claim 11, wherein the copy procedure corresponding to the copy command comprises the normal read procedure and a normal write procedure, wherein the normal read procedure comprises reading from the source address and the normal write procedure comprises writing into the destination address.

13. The method of claim 10, wherein transmitting the data to the output buffer through the data line after performing the read operation comprising:

transmitting the data from the source address to the output buffer through a first interface connected to the data line in response to the special read input having received the first predetermined binary value.

14. The method of claim 13, wherein transmitting the data stored in the output buffer to the destination address through the data line comprising:

transmitting the data from the output buffer directly back to the data line to be written into the destination address instead of being received by the memory controller in response to the special write input receiving the second predetermined binary value.

15. The method of claim 9, wherein the output buffer comprising a first interface connected to the data line, a second interface connected to the write driver, and a third interface, and transmitting the data stored in the output buffer to the destination address through the data line comprising:
- transmitting the data stored in the output buffer directly to an input buffer through the third interface;
- storing the data in the input buffer; and
- transmitting the data from the input buffer to the destination address.

16. The method of claim 15, wherein transmitting the data stored in the output buffer directly to the input buffer through the third interface further comprising:
- transmitting the data from the input buffer to the destination address without having the data read by the memory controller.

17. An electronic device comprising:
- a controller; and
- a memory device electrically connected to the controller, the memory device comprising:
  - a memory array comprising a first memory location and a second memory location;
  - a data line electrically connected to the memory array and configured to receive, from the first memory location, the data to be transmitted to the second memory location through the same data line in response to a copy command;
  - an output buffer connected to a read driver and configured to store the data received from the first memory location through the data line to be written directly into the second memory location in response to the copy command; and
  - an input buffer connected to a write driver and configured to receive the data transferred from the output buffer, wherein the output buffer is a read latch.

18. The electronic device of claim 17, wherein the memory device further comprises:
- a command decoder configured to receive the copy command to copy data stored in the first memory location to the second memory location,
- wherein the command decoder comprising a special read input and a special write input as the copy command is deteiniined based on at least a first predetermined binary value received by the special read input and a second predetelin ined binary value received by the special write input.

19. The electronic device of claim 18, wherein output buffer comprises a first interface connected to the data line and a second interface connected to the read driver as the data is received by the output buffer in response to the special read input receiving the first predetermined binary value, and the output buffer is configured to
- output the data directly back to the data line to be written into the second memory location instead of being received by the controller.

20. The electronic device of claim 19 further comprising:
- an input buffer which comprises a first interface connected to the data line, a second interface connected to the write driver, and a third interface connected to the output buffer, and the input buffer is configured to receive the data transferred from the output buffer directly through the third interface so as to output the data to the data line to be written into the second memory location without transmitting the data to the controller.

* * * * *